United States Patent [19]

Higuchi et al.

[11] 4,321,489
[45] Mar. 23, 1982

[54] VOLTAGE DETECTION CIRCUIT

[75] Inventors: Mitsuo Higuchi, Tokyo; Kazuhisa Nakamura, Sagamihara; Kohichi Maeda, Yokohama, all of Japan

[73] Assignee: Fujitsu Ltd., Kawasaki, Japan

[21] Appl. No.: 62,488

[22] Filed: Jul. 31, 1979

[30] Foreign Application Priority Data

Jul. 31, 1978 [JP] Japan .................................. 53-93501

[51] Int. Cl.³ .................. H03K 17/687; H03K 5/153; H03K 5/24
[52] U.S. Cl. .................................... 307/362; 307/450; 307/360; 365/226
[58] Field of Search ................... 307/296 A, 360, 362, 307/363, 448–450; 365/189, 184, 185, 226

[56] References Cited

U.S. PATENT DOCUMENTS

| | | | |
|---|---|---|---|
| 3,789,246 | 1/1974 | Preisig | 330/277 X |
| 4,013,902 | 3/1977 | Payne | 307/363 X |
| 4,048,524 | 9/1977 | Laugesen et al. | 307/360 X |
| 4,140,930 | 2/1979 | Tanaka | 307/362 |
| 4,224,539 | 9/1980 | Musa et al. | 307/362 |

*Primary Examiner*—Larry N. Anagnos

*Attorney, Agent, or Firm*—Staas & Halsey

[57] ABSTRACT

A voltage detection circuit, for detecting two voltages, that is, a high voltage level and a low voltage level, is disclosed. The voltage detection circuit according to the present invention includes a load element group having a first terminal and a second terminal, and a transistor which is connected between the second terminal of the load element group and ground. The sum of threshold voltages of the load element group has a value higher than the low voltage level to be detected and lower than the high voltage level to be detected. The load element group is kept in an off state when the low voltage level is applied thereto and is kept in on state when the high voltage level is applied thereto. The voltage to be detected is applied to the first terminal of the load element group and, when the voltage to be detected has a high voltage level, a low voltage is supplied to a control terminal of the transistor, and; when the voltage to be detected has a low voltage level, a high voltage is supplied to the control terminal of the transistor, so that the voltage to be detected is estimated by a voltage at a connection point between the second terminal of the one space load element group and the transistor.

14 Claims, 4 Drawing Figures

VOLTAGE DETECTION CIRCUIT

BACKGROUND OF THE INVENTION

1. Field of the Invention

The present invention relates to a voltage detection circuit for detecting whether a voltage to be detected has a high voltage level or a low voltage level.

2. Description of the Prior Art

One type of semiconductor memory device, uses, as a memory element, MOS field effect transistors having a floating gate electrode and a control gate electrode. When information is written in the device, that is, in a program mode, a voltage, for example, of about +25 volts, should be supplied to a control gate of the MOS field effect transistor. When information is read from the device, a voltage, for example, of about +5 volts, should be supplied to the control gate of the MOS field effect transistor. In such a semiconductor memory device, it is necessary to detect whether the supplied voltage is low, for example 5 volts, or high, for example 25 volts. It is also necessary to control a program circuit or the read out circuit so as to keep the program circuit or the read out circuit in an operating state or in a non operating state. When a voltage having these two different values is detected, the low voltage has a value of about 5 volts, therefore a typical MOS field effect transistor will be placed in a conductive state even if as little as 5 volts is applied thereto. Therefore, a special design is required for the voltage detection circuit.

When a voltage detection circuit is constructed using a MOS FET (Metal-Oxide-Semiconductor Field Effect Transistor), a series circuit consisting of a depletion type MOS FET and an enhancement type MOS FET, that is, an enhancement/depletion mode inverter circuit, has been conventionally used. In this conventional voltage detection circuit, the current in the enhancement type MOS FET used as a driver should be selected to be smaller than the current in the depletion type MOS FET, so that when the supplied voltage is low, for example 5 volts, the enhancement type MOS FET is kept in an on state, while the voltage level at a connection point between the two MOS FETs is kept at a relatively high level. When the supplied voltage is high, for example 25 volts, the enhancement type MOS FET is placed in the complete on state, and the voltage level at the connection point between the two MOS FETs is maintained at the sufficiently low level. Therefore, the supplied voltage level is detected by using the voltage level difference at the connection of the two MOS FETs.

In the above-mentioned conventional voltage detection circuit, the ratio of the dimensions of the enhancement type MOS FET to the depletion type MOS FET must be strictly determined, so that the design of the circuit and the formation of the element are difficult.

SUMMARY OF THE INVENTION

An object of the present invention is to overcome the drawbacks of the conventional voltage detection circuit and to provide a novel voltage detection circuit which can be easily formed.

Another object of the present invention is to provide a novel voltage detection circuit which can reliably carry out voltage detection.

A further object of the present invention is to provide a novel voltage detection circuit which has a simple construction and small dimensions.

The above mentioned objects can be achieved by the voltage detection circuit, of the present invention, which detects two voltages, that is, a low voltage level and a high voltage level. The circuit comprises a load element group which provides a first terminal and a second terminal, and a transistor which is connected between the second terminal of the load element group and ground. The sum of the threshold of the load element group has a value higher than the low voltage level to be detected and lower than the high voltage level to be detected. The load element group is kept in an off state when the low voltage level is applied thereto and in an on state when the high voltage level is applied thereto. The voltage to be detected is applied to the first terminal of the load element group and when the voltage to be detected has a high voltage level a low voltage is supplied to a control terminal of the transistor. When the voltage to be detected has a low voltage level a high voltage is supplied to the control terminal of the transistor, so that the voltage to be detected is estimated by a voltage at a connection point between the second terminal of the load element group and the transistor.

Further features and advantages of the present invention will be apparent from the ensuing description with reference to the accompanying drawings to which, however, the scope of the invention is in no way limited.

DESCRIPTION OF THE PREFERRED EMBODIMENT

In a semiconductor integrated circuit device or in the electronic circuit, sometimes, two positive or negative voltages having different voltage values are used. For example, in a semiconductor memory device, which uses, as memory elements, double gate MOS FETs having a floating gate electrode and a control gate electrode, when the information is written in the device, that is, in the program state, a voltage, for example, of about +25 volts, is supplied to the control gate of the MOS FET and when the information is read out from the device, a voltage, for example, of about +5 volts, is supplied to the control gate of the MOS FET.

In the above mentioned semiconductor memory device or electronic circuit, it is necessary to detect whether the applied voltage is of a low voltage level or a high voltage level, and to control the control circuit in the semiconductor memory device or the control circuit in the electronic circuit in such a manner that the control circuit is kept in an operating or non-operating state. For example, in a semiconductor memory device which uses double gate MOS FETs, it is necessary to detect whether the applied voltage is +25 volts, or +5 volts and to keep the write circuit of the memory elements, that is, the program circuit or the read out circuit, in the operating state or the non-operating state. The process for selectively keeping the desired circuit in the non-operating state is necessary to prevent circuit malfunction and is effective for the purpose of decreasing the power dissipation of the semiconductor memory device and, also, for the purpose of decreasing the dimensions of the electric power source circuit.

Figure 1:
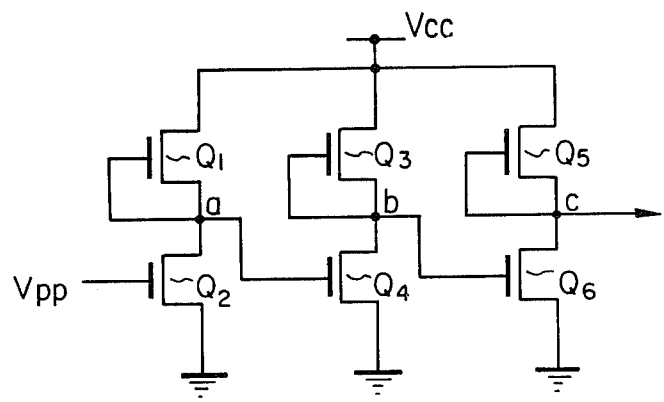
FIG. 1 is a circuit diagram of an example of a conventional voltage detection circuit.

For the voltage detection circuit for detecting whether the applied voltage is high or low when the applied voltage has different voltage values, when the voltage detection circuit is constituted by MOS FET (Metal-Oxide-Semiconductor Field Effect Transistor) circuits, a circuit which is formed by the series connection of a desired number of inverters was conventionally used. The inverters are constructed from depletion type MOS FETs, which are used as a load, and enhancement type MOS FETs, which are used as a driver. FIG. 1 illustrates such a conventional voltage detection circuit. Referring to FIG. 1, $Q_1$ through $Q_6$ denote MOS FETs, $V_{cc}$ denotes a source voltage of a constant 5 volts and $V_{pp}$ denotes a voltage to be detected, which varies, for example, from 5 volts to 25 volts. Referring to FIG. 1, $Q_1$, $Q_3$ and $Q_5$ are depletion type MOS FETs, and $Q_2$, $Q_4$ and $Q_6$ are enhancement type MOS FETs. The voltage detection circuit illustrated in FIG. 1 is constructed of three inverter stages which are connected in series. In the circuit illustrated in FIG. 1, when the voltage $V_{pp}$ is applied to the FET $Q_2$, the FET $Q_2$ is placed in an on state even if the voltage $V_{pp}$ is 5 volts. Therefore, a current which flows in the MOS FET $Q_2$ should be selected to be smaller than the current in the MOS FET $Q_1$. Although, the MOS FET $Q_2$ is placed in an on state even if the voltage $V_{pp}$ is of a low level, the potential at a connection point "a" of the MOS FETs $Q_1$ and $Q_2$ is relatively high, so that the driver MOS FET $Q_4$ in the next stage is placed in an on state and the voltage level of a connection point "b" of the MOS FETS $Q_3$ and $Q_4$ falls. Therefore, the driver MOS FET $Q_6$ in the next stage is placed in an off state, and the voltage level at a connection point "c" of the MOS FETs $Q_5$ and $Q_6$, that is, an output terminal, is placed in an "H" (high) voltage level. When the voltage $V_{pp}$ is "H" (high) voltage level, for example, 25 volts, the MOS FET $Q_2$ is placed in the complete on state, the MOS FET $Q_4$ is placed in an off state, the MOS FET $Q_6$ is placed in an on state, and, the voltage level at the output terminal "c" is placed in an "L" (low) voltage level, so that the voltage level $V_{pp}$ can be detected.

However, in the circuit illustrated in FIG. 1, the dimensions of each of the MOS FETs which form the inverter circuits, especially the ratio of the gate length to gate width, must be strictly determined, and therefore, the design of the circuit and the formation of the MOS FETs are troublesome. Furthermore, in the circuit illustrated in FIG. 1, the value of the "H" voltage level appearing at the output terminal "c" is lower than the voltage $V_{cc}$, even in the maximum state, and, this "H" voltage level is not sufficiently high for a simplification and a miniaturization of a following circuit not shown in FIG. 1.

According to the present invention, instead of the prior circuit illustrated in FIG. 1, a voltage detection circuit, which can be easily designed and formed, which can reliably carry out voltage detection and which can obtain sufficient voltage level at the output terminal, is provided.

Figure 2:
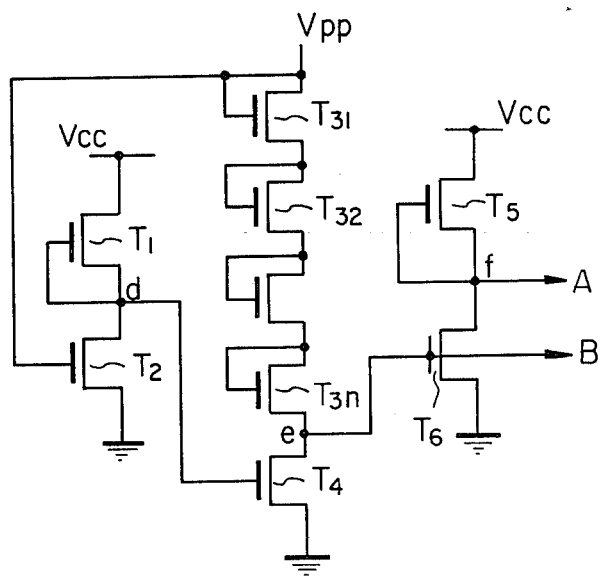
FIG. 2 is a circuit diagram of one embodiment of a voltage detection circuit according to the present invention.

FIG. 2 illustrates the voltage detection circuit according to the present invention. Referring to FIG. 2 $T_1$, $T_2$, $T_{31} \sim T_{3n}$, $T_4$, $T_5$ and $T_6$ denote MOS FETs. Of these, MOS FETs $T_1$ and $T_5$ are depletion type MOS FETS and each forms a load of an inverter circuit, $T_{31} \sim T_{3n}$ are enhancement type MOS FETS which are used as a load element group, and $T_2$, $T_4$ and $T_6$ are enhancement type MOS FETs which are used as drivers of the inverter circuits.

Each of the MOS FETs $T_{31} \sim T_{3n}$, which are used as the load element group, has a gate and a drain which are short circuited, and these MOS FETs are connected in series. The value of the sum of the threshold voltages ($V_{th}$) of these MOS FETs $T_{31} \sim T_{3n}$ ($n \times V_{th}$) is selected to be greater than the low level of the electric source voltage $V_{pp}$ and, therefore, the MOS FETs $T_{31} \sim T_{3n}$ are kept in an off state when the electric source $V_{pp}$ is at a low level.

The ratio of the dimensions of the MOS FETs $T_1$ and $T_2$ is suitably selected to be the same as the prior circuit illustrated in FIG. 1, so that the voltage level at the connection point "d" of the MOS FETs $T_1$ and $T_2$ is kept at a relatively high level when the FET $T_2$ is placed in an on state by a low level of the voltage $V_{pp}$ and the next stage MOS FET $T_4$ is placed in an on state. However, in the circuit shown in FIG. 2, the on state of the MOS FET $T_4$ need not be complete, therefore, wide range for the variation of the potential at point "d" can be obtained. Furthermore, MOS FETs $T_5$ and $T_6$ form an inverter for supplying the output voltage B and the output voltage A, respectively, the voltage A having a reverse polarity with respect to the output voltage B.

In the voltage detection circuit according to the present invention, as illustrated in FIG. 2, when we assume that the threshold voltage of each of the MOS FETs $T_{31} \sim T_{3n}$ is 2.0~2.5 volts, the value of n is "4" and the voltage source $V_{pp}$ to be detected is at an "L" level, for example 5 volts, the MOS FETs $T_{31} \sim T_{3n}$ are kept in an off state. On the other hand, if the MOS FET $T_2$ is placed in an on state, and the potential at the connection point "d" of the MOS FET $T_1$ used as the load and the MOS FET $T_2$ is relatively high, then the next stage MOS FET $T_4$ is placed in an on state.

As the MOS FETs $T_{31} \sim T_{3n}$ are placed in an off state, even if the MOS FET $T_4$ is in the incomplete on state, the potential at the connection point of the MOS FETs $T_{31} \sim T_{3n}$ and the MOS FET $T_4$ is at a sufficiently low level so that the output stage MOS FET $T_6$ is placed in an off state. Therefore, the output level B is "L" level and output level A is "H" level ($V_{cc}$ at maximum).

When the voltage level $V_{pp}$ is at an "H" level, for example, 25 volts, the MOS FET $T_2$ is placed in the complete on state and the potential at the connection point "d" of the MOS FET $T_1$ used as the load and the MOS FETs $T_2$ is at the "L" level, so that the MOS FET $T_4$ is placed in an off state.

On the other hand, when the voltage source $V_{pp}$ is at an "H" level, the MOS FETs $T_{31} \sim T_{3n}$ are also kept in an on state, and the "H" voltage level, less the sum of the threshold voltages of the MOS FETs $T_{31} \sim T_{3n}$ ($n \times V_{th}$) from the voltage $V_{pp}$, appears at the connection point "e" of the MOS FETs $T_{31} \sim T_{3n}$ and the MOS FET $T_4$. Therefore, the "H" level appears as the output voltage B and the "L" level appears as the output voltage A.

In the voltage detection circuit according to the present invention, the inverter circuit formed by the MOS FETs $T_5$ and $T_6$ is not always necessary. When whether the voltage is "H" level or "L" level is the only thing to be detected, the level of the voltage to be detected can be estimated by the voltage level appearing at the connection point "e" of the MOS FETs $T_{31} \sim T_{3n}$ and the MOS FET $T_4$. Therefore, by introducing the voltage level at the connection point "e" to a control circuit of a display device, the display device can be driven only when the voltage level at the connection point "e" is kept in an "H" level; that is, the voltage to be detected is kept in an "H" level.

Figure 3:
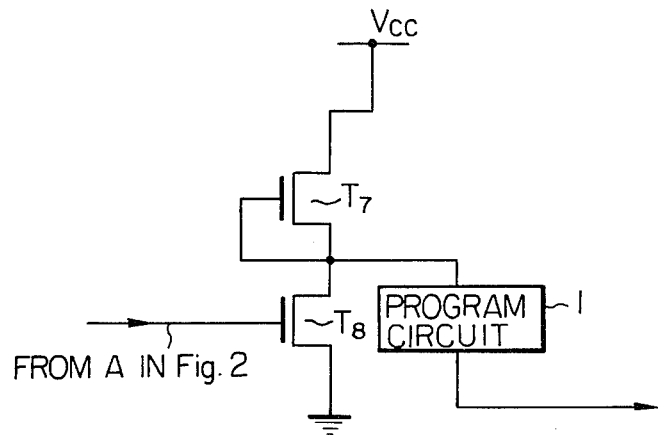
FIGS. 3 and 4 are circuit diagrams of circuits which are connected to the voltage detection circuit according to the present invention.
Figure 4:
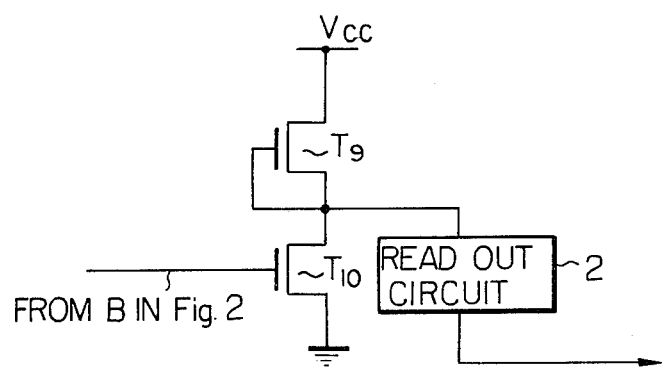

When the inverter circuit formed by the MOS FETs $T_5$ and $T_6$ is used as illustrated in FIG. 2, outputs having an opposite polarity can be simultaneously obtained at a connection point "f" of the MOS FET $T_5$ used as a load and the MOS FET $T_6$ used as a driver, and at the connection point "e". That is, when the output B at the connection point "e" is in an "L" voltage level, the output A at the connection point "f" is kept in an "H" voltage level, and when the output B at the connection point "e" is kept in and "H" voltage level, the output A at the connection point "f" is kept in an "L" voltage level. By using these two outputs having an opposite polarity, the operation of circuits which are operated reciprocally in a semiconductor integrated device or in the electronic circuit can be controlled. For example, in a semiconductor memory device, a write circuit, that is, a program circuit, and a read out circuit are used for controlling memory elements. The program circuit and read out circuit are connected via a suitable buffer circuit to a decoder which is connected to the above-mentioned memory elements. In this circuit arrangement, the program circuit and the read out circuit are operated reciprocally that is, during programming, only the program circuit is in the operating state and the read out circuit must stay in the non-operating state in order not to affect other circuits. On the other hand, during reading, only the read out circuit is in the operating state and the program circuit should be in the non-operating state. Therefore, when an inverter circuit is inserted respectively into a part of the program circuit and the read out circuit, and when the outputs A and B in the voltage detection circuit according to the present invention are supplied to control terminals of the inverter circuits, the program circuit and the read out circuit can be switched easily. That is, as illustrated in FIG. 3 an inverter circuit, which is formed by the series connection of a depletion type MOS FET $T_7$ used as a load and an enhancement type MOS FET $T_8$ used as a driver, is connected to a program circuit 1. The output A of the voltage detection circuit, illustrated in FIG. 2, is connected to a gate of the MOS FET $T_8$. Furthermore, as illustrated in FIG. 4, an inverter circuit, which is formed by the series connection of a depletion type MOS FET $T_9$ used as a load and an enhancement type MOS FET $T_{10}$ used as a driver, is connected to a read out circuit 2. The output B of the voltage detection circuit, illustrated in FIG. 2, is connected to a gate of the MOS FET $T_{10}$.

By using the above-mentioned construction, when an "H" voltage level, that is, for example, a write voltage of 25 volts, is supplied as the voltage to be detected $V_{pp}$, the output terminal B is placed at the "H" voltage level, so that the MOS FET $T_{10}$ connected to the output terminal B is placed in an on state and an internal voltage level in the read out circuit 2 drops to zero. Therefore, the operation of the read out circuit is stopped. On the other hand, as the output terminal A is "L" voltage level, therefore the MOS FET $T_8$ connected to the output terminal A is placed in an off state, and an internal voltage level in the program circuit 1 does not drop to zero, and the predetermined program operation can be carried out.

When the "L" voltage level, that is, for example, a read out voltage of 5 volts, is supplied as the voltage to be detected $V_{pp}$, the output terminal B is placed in "L" voltage, so that the MOS FET $T_{10}$ connected to the output terminal B is placed in an off state, and therefore, the operation of the readout circuit can be carried out. On the other hand, as the output terminal A is "H" level state, therefore the MOS FET $T_8$ connected to the output terminal A is placed in an on state, and an internal voltage level in the program circuit 1 drop to zero, and therefore, the operation of the program circuit 1 is stopped.

The voltage detection circuit according to the present invention provides the following advantages: (a) The MOS FETs, which should be designed by taking into consideration the ratio of the dimensions, are only MOS FETs $T_1$ and $T_2$ which are used in the initial stage. It is not necessary to consider the ratio of the dimensions of the other MOS FETs $T_{31} \sim T_{3n}$, and $T_4$. The ratio of the dimensions of the MOS FETS $T_5$ and $T_6$ should be considered, but these MOS FETs can be easily formed, because a large amplitude of the electric voltage can be applied at the connection point "e". (b) Although the voltage $V_{pp}$ is applied to a gate of the MOS FET $T_2$, and to a drain and a gate of the MOS FET $T_{31}$, the gate current of the MOS FETs can be neglected. Furthermore, the MOS FETs $T_{31} \sim T_{3n}$ are kept in an off state when the electric source $V_{pp}$ is "L" voltage level, and, although these MOS FETs $T_{31} \sim T_{3n}$ are kept in an on state when the electric source $V_{pp}$ is "H" voltage level, the MOS FET $T_4$ is kept in an off state and the voltage source $V_{pp}$ is applied only to the output terminal B. Therefore, when an input impedance of a following circuit (not illustrated in FIG. 2) is high, the current does not flow in the voltage detection circuit, therefore, the voltage $V_{pp}$ can be detected without extracting the current from the voltage source $V_{pp}$. (c) The maximum output level "H" in the conventional circuit illustrated in FIG. 1 is lower than the voltage $V_{cc}$, however, in the voltage detection circuit according to the present invention, the maximum output level "H" is near the voltage $V_{pp}$. For example, when the voltage $V_{pp}$ is 25 volts, the threshold voltage of each of the MOS FETs $T_{31} \sim T_{3n}$ is 2.5 volts and the value of "n" is "4", an output voltage of about $25-2.5\times4=15$ volts can be obtained at the output terminal. This is effective for the purpose of simplifying and miniaturizing the construction of the following circuit, not illustrated in FIG. 2. The maximum output level "H" can be adjusted by increasing or decreasing the number of the MOS FETs $T_{31} \sim T_{3n}$ which are connected in series.

In the description of the invention, the MOS FETs $T_{31} \sim T_{3n}$ which are connected in series are used as the load element group. However, the present invention is not to be limited to the construction including the MOS FETs $T_{31} \sim T_{3n}$, and a predetermined number of PN junction diodes which are connected in series can be used as the load element group.

In such a case, that is, when the PN junction diodes are used as the load element group, the state in which all PN junction diodes connected in series are placed in a conductive state is used as the on state of the load element group, and the state in which all PN junction diodes connected in series are placed in non-conductive state is used as the off state of the load element group. Therefore, the number of the PN junction diodes connected in series is selected in such a manner that, the voltage to be detected $V_{pp}$ has a sufficient value for placing all PN junction diodes connected in series in conductive state, that is, for example, 25 volts, the load element group formed by the PN junction diodes is placed in the on state, and the voltage to be detected $V_{pp}$ has a value for placing all PN junction diodes connected in series in non-conductive state, that is, for example, 5 volts, the load element group formed by the PN junction diodes is placed in the off state.

What is claimed is:

1. A voltage detection circuit, for detecting whether a voltage to be detected has a high voltage level or a low voltage level, comprising:
   load element group means, having a first terminal and a second terminal, for providing a load;
   a transistor, having a control terminal, operatively connected between said second terminal and ground, wherein the sum of the threshold voltages of said load element group means is higher than the low voltage level to be detected and lower than the high voltage level to be detected, said load element group means being kept in an off state when the low voltage level is applied thereto and in an on state when the high voltage level is applied thereto, wherein the voltage to be detected is applied to said first terminal;
   means for supplying a low voltage to said control terminal of said transistor when the voltage to be detected has a high voltage level; and
   means for supplying a high voltage to said control terminal of said transistor when the voltage to be detected has a low voltage level, so that the voltage to be detected is estimated by a voltage at a connection point between said second terminal of said load element group means and said transistor.

2. A voltage detection circuit according to claim 1, wherein said load element group means comprises a plurality of enhancement type MOS FETs connected in series between said first terminal and said second terminal.

3. A voltage detection circuit according to claim 2, wherein the gate and the drain of each of said plurality of enhancement type MOS FETs are short circuited.

4. A voltage detection circuit according to claim 1, wherein said load element group means comprises a plurality of PN junction diodes connected in series between said first terminal and said second terminal.

5. A voltage detection circuit according to claim 1, wherein said transistor comprises an enhancement type MOS FET.

6. A voltage detection circuit for detecting whether a voltage to be detected has a high voltage level or a low voltage level comprising: a load element group means having a first terminal to which the voltage to be detected is applied, wherein the sum of the threshold voltages of said load element group means is higher than the low voltage level to be detected and lower than the high voltage level to be detected, wherein said load element group means is kept in an off state when the low voltage level is applied thereto and in an on state when the high voltage level is applied thereto; a first transistor operatively connected between said second terminal and ground, wherein said load element group means and said first transistor comprise a first inverter; and a second inverter, having an output, comprising a series connection of a second transistor and a third transistor, having an input terminal, wherein the voltage to be detected is supplied to the input terminal of said third transistor, said second inverter supplying a low output voltage when the voltage to be detected has a high voltage level and supplying a high voltage output when the voltage to be detected has a low voltage level, so as to control said first inverter, so that the level of the voltage to be detected is estimated by the voltage at a connection point between said second terminal of said load element group and said first transistor.

7. A voltage detection circuit according to claim 6, wherein said second transistor comprises a depletion type MOS FET used as a load, and wherein said third transistor comprises an enhancement type MOS FET used as a driver.

8. A voltage detection circuit according to claim 7, wherein the voltage to be detected is supplied to the gate of said enhancement type MOS FET of said second inverter.

9. A voltage detection circuit according to claim 6, wherein said output of said second inverter is applied to the gate of said first transistor of said first inverter.

10. A voltage detection circuit according to claim 6, further comprising: a third inverter, connected to the output of said first inverter, said third inverter comprising a fourth transistor and a fifth transistor connected in series, wherein said fifth transistor is controlled by the output of said first inverter, whereby said third inverter supplies a first output which is the output of said first inverter and a second output which is the inverse of said first output.

11. A voltage detection circuit, operatively connected to a voltage to be detected, a power supply voltage, and to ground, for detecting a high voltage level and a low voltage level, comprising:
   a load element means, having a first terminal operatively connected to the voltage to be detected and having a second terminal, for determining the magnitude of the voltage to be detected, wherein the sum of the threshold voltages of said load element means is greater than the low voltage level to be detected and lower than the high voltage level to be detected;
   a first FET, having a drain operatively connected to said second terminal, having a source operatively connected to ground and having a gate;
   a second FET, having a drain operatively connected to the power supply voltage, having a gate operatively connected to said gate of said first FET at a first node and having a source operatively connected at said first node;
   a third FET, having a gate operatively connected at said first terminal, having a drain operatively connected at said first node and having a source operatively connected to ground;
   a fourth FET, having a drain operatively connected to the power supply voltage, having a gate, and having a source operatively connected to said gate of said fourth FET at a second node;
   a fifth FET, having a drain operatively connected at said second node, having a gate operatively connected at said second terminal and having a source operatively connected to ground,
   wherein said load element means is kept in an off state when the voltage to be detected has a low voltage level, wherein said load element means is kept in an on state when the voltage to be detected has a high voltage level and wherein the level of the voltage to be detected can be approximately determined by the voltage between said second terminal and ground.

12. A voltage detection circuit as set forth in claim 11, wherein said load element means comprises a plurality of enhancement type MOS FETs connected in series between said first terminal and said second terminal.

13. A voltage detection circuit as set forth in claim 11, wherein said load element means comprises a plurality of PN junction diodes connected in series between said first terminal and said second terminal.

14. A voltage detection circuit as set forth in claim 11, 12 or 13, wherein said second and fourth FETs are depletion type MOS FETs and wherein said first, third and fifth FETs are enhancement type MOS FETs.

* * * * *